(12) United States Patent
Chia

(10) Patent No.: US 9,041,136 B2
(45) Date of Patent: May 26, 2015

(54) AVALANCHE PHOTODIODE

(71) Applicant: Agency for Science, Technology and Research, Singapore (SG)

(72) Inventor: Ching Kean Chia, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 0 days.

(21) Appl. No.: 14/351,608

(22) PCT Filed: Oct. 19, 2012

(86) PCT No.: PCT/SG2012/000394
§ 371 (c)(1),
(2) Date: Apr. 14, 2014

(87) PCT Pub. No.: WO2013/058715
PCT Pub. Date: Apr. 25, 2013

(65) Prior Publication Data
US 2014/0319638 A1    Oct. 30, 2014

(30) Foreign Application Priority Data

Oct. 20, 2011  (SG) .................. 201107712-0

(51) Int. Cl.
*H01L 31/107*  (2006.01)

(52) U.S. Cl.
CPC .................. *H01L 31/107* (2013.01)

(58) Field of Classification Search
USPC .................. 257/438, 431
See application file for complete search history.

(56) References Cited

U.S. PATENT DOCUMENTS

2006/0202297 A1    9/2006  Ishimura

OTHER PUBLICATIONS

"International Application No. PCT/SG2012/000394, International Preliminary Report on Patentability dated Sep. 10, 2013", 10 pgs.
"International Application No. PCT/SG2012/000394, International Search Report dated Dec. 5, 2012", 5 pgs.

*Primary Examiner* — Long Pham
(74) *Attorney, Agent, or Firm* — Schwegman Lundberg & Woessner, P.A.

(57) ABSTRACT

According to one aspect, there is provided an avalanche photodiode comprising a first semiconductor layer that absorbs photons of a first wavelength range and having a first energy bandgap; a second semiconductor layer that absorbs photons of a second wavelength range and having a second energy bandgap, the second energy bandgap being different from the first energy bandgap; and a control layer between the first semiconductor layer and the second semiconductor layer, the control layer having a third energy bandgap engineered to suppress carriers created from dark current.

14 Claims, 15 Drawing Sheets

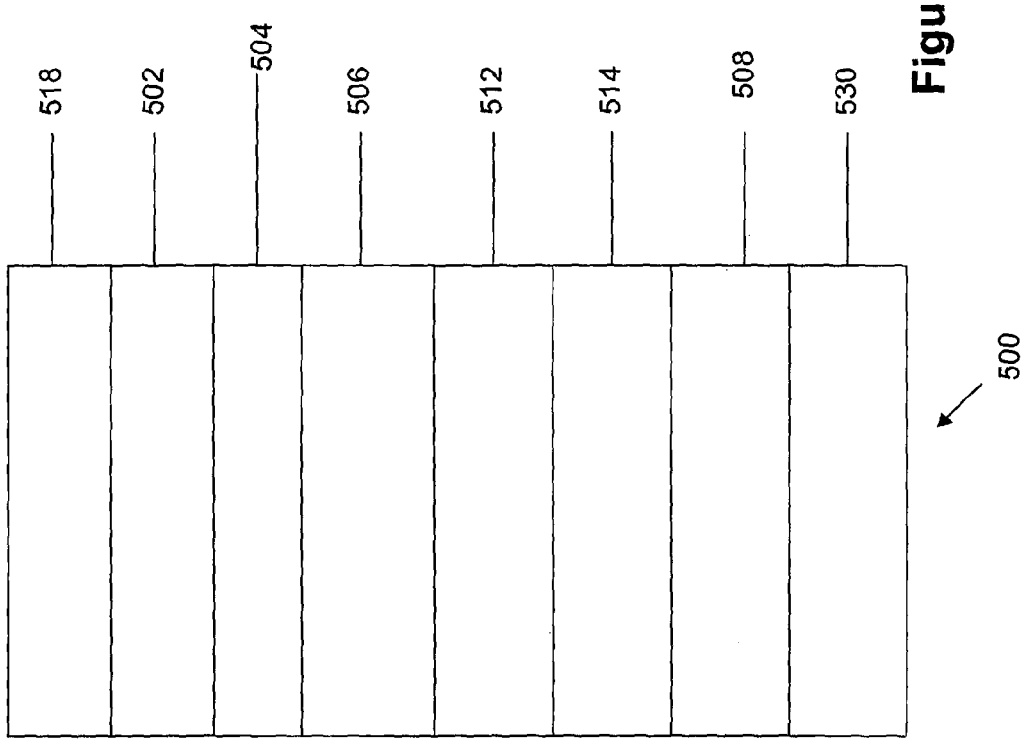

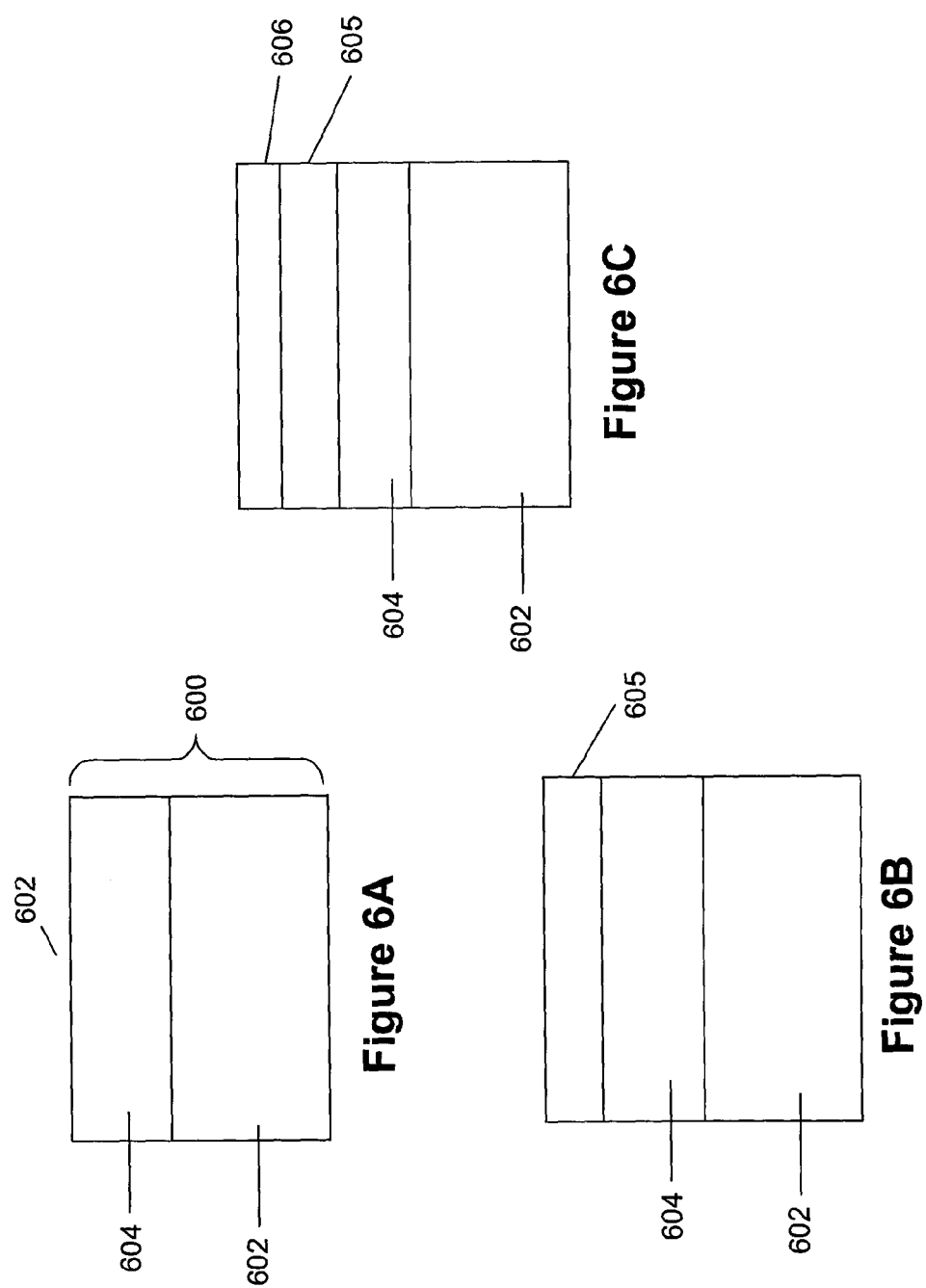

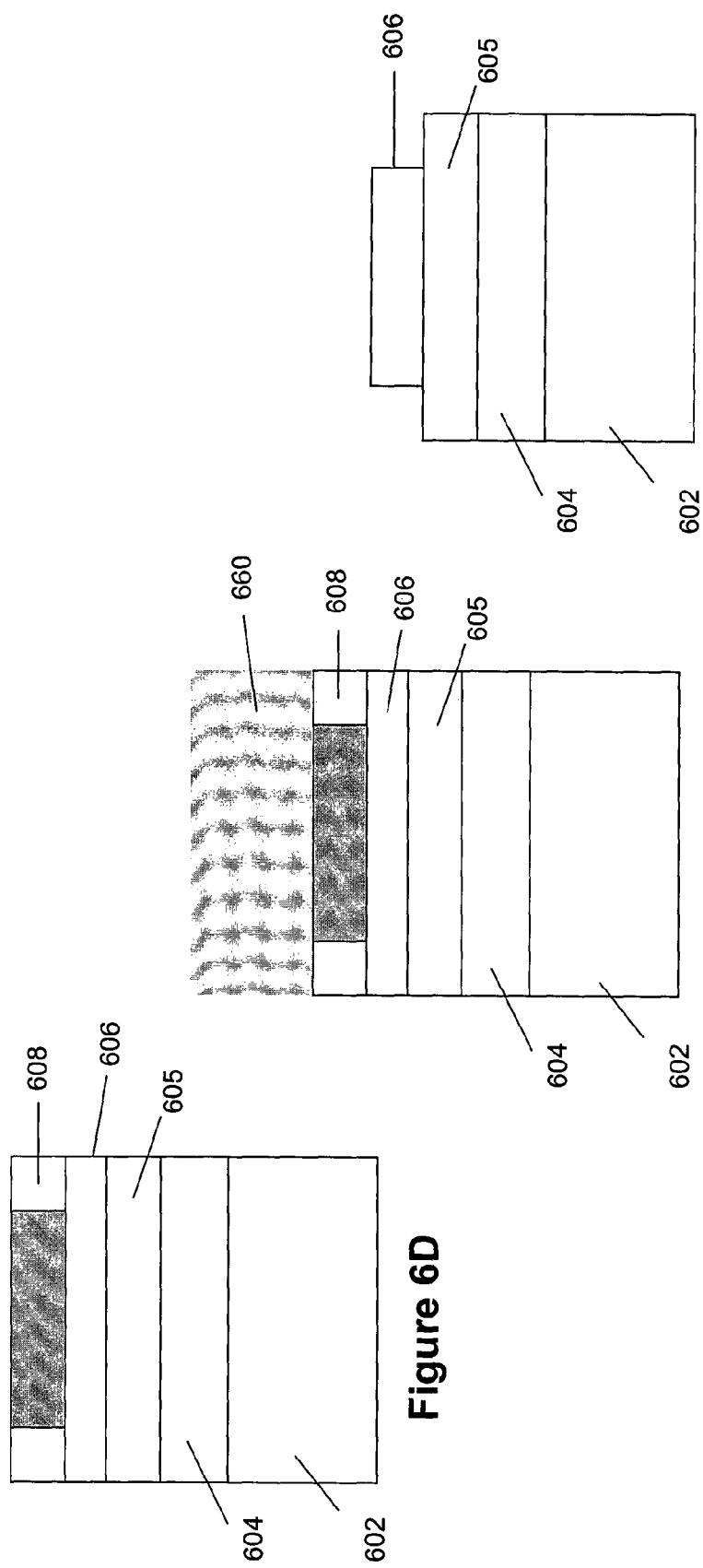

AVALANCHE PHOTODIODE

PRIORITY CLAIM TO RELATED APPLICATIONS

This application is a U.S. national stage application filed under 35 U.S.C. §371 from International Application Serial No. PCT/SG2012/000394, which was filed Oct. 19, 2012, and published as WO 2013/058715 on Apr. 25, 2013, and which claims priority to Singapore Application No. 201107712-0, filed Oct. 20, 2011, which applications and publication are incorporated by reference as if reproduced herein and made a part hereof in their entirety, and the benefit of priority of each of which is claimed herein.

FIELD OF INVENTION

The invention relates generally to an avalanche photodiode.

BACKGROUND

Existing pin diodes and avalanche photodiodes (APDs) are sensitive for a particular wavelength range, depending on their specific absorption bands. For example Si (silicon) APDs are sensitive in the range of 450-1000 nm, Ge (germanium) APDs spectral response range covers 780-1700 nm, whereas InGaAs (indium gallium arsenide) APDs are responsive at 800-1650 nm.

Examples of APD application include receivers in optical fiber communications, range finding, imaging, high-speed laser scanners, laser microscopy, and optical time domain reflectometry.

InGaAs APDs are more expensive than Ge APDs, but have better noise performance. Due to its narrow energy bandgap, Ge exhibits high dark current at room temperature, and high multiplication noise due to very similar electron and hole ionization coefficients.

When operated in the Geiger-mode (reverse bias above the breakdown voltage, $V_{br}$), APDs can be used as SPADs (single-photon avalanche diodes). When an electron-hole pair is generated by the absorption of a single photon in a SPAD, it can trigger a strong avalanche current. Geiger-mode performance is primarily characterized by the single-photon quantum efficiency (SPQE). The SPQE is defined as the probability that a photon triggers an avalanche breakdown and no dark carrier triggers a breakdown (dark-count) given that an optical pulse is present and at least one photon enters on the SPAD. SPQE is defined as $$SPQE = \frac{(1 - P_d) P_{opt}}{p_o}$$

where $P_d$ is the dark-count probability, $P_{opt}$ is the probability that at least one photon triggers an avalanche breakdown, and $P_o$ is the probability that at least one photon enters on the SPAD during the detection time.

$$P_d = 1 - e^{-Q_a N_d}$$

where $Q_a$ is the probability that a dark carrier triggers an avalanche breakdown and $N_d$ is the average number of dark carriers generated in the multiplication region during the detection time.

$$P_{opt} = 1 - e^{-\eta P_a N_o}$$

where $N_o$ is the average number of photons per pulse, $P_a$ is the probability of an avalanche breakdown caused by a photocarrier that is injected into the multiplication region, and $\eta$ is the quantum efficiency of the SPAD, which is the probability that an impinging photon is absorbed and converted into an electron-hole pair. Also, the probability that at least one photon is present in the optical pulse is given by $$p_o = 1 - e^{-N_o}$$

From the above equations, it is therefore necessary for SPADs to have low dark current characteristics to minimize "dark count".

Applications that use SPADs can be grouped into 2 general categories depending on the wavelengths to be detected. Si-based SPADs are typically used for visible spectral range up to 1-μm wavelength, while InGaAs/InP SPADs are used for wavelengths from 1-μm to about 1.8 μm. Si and InGaAs/InP based SPADs typically suffer from high dark current.

A need therefore exists to provide an avalanche photodiode that can address high dark current found in existing APDs and SPADs.

SUMMARY

According to one aspect, there is provided an avalanche photodiode comprising a first semiconductor layer that absorbs photons of a first wavelength range and having a first energy bandgap; a second semiconductor layer that absorbs photons of a second wavelength range and having a second energy bandgap, the second energy bandgap being different from the first energy bandgap; and a control layer between the first semiconductor layer and the second semiconductor layer, the control layer having a third energy bandgap engineered to suppress carriers created from dark current.

BRIEF DESCRIPTION OF THE DRAWINGS

Example embodiments of the invention will be better understood and readily apparent to one of ordinary skill in the art from the following written description, by way of example only, and in conjunction with the drawings. The drawings are not necessarily to scale, emphasis instead generally being placed upon illustrating the principles of the invention, in which:

FIG. 3A shows the structure of an avalanche photodiode according to an additional embodiment, while

FIG. 4A shows the structure of an avalanche photodiode according to another embodiment, while

FIG. 5A shows the structure of an avalanche photodiode according to yet another embodiment, while

FIGS. 6A to 6L show a process to fabricate an avalanche photodiode (APD) according to various embodiments.

DEFINITIONS

Figure 1:
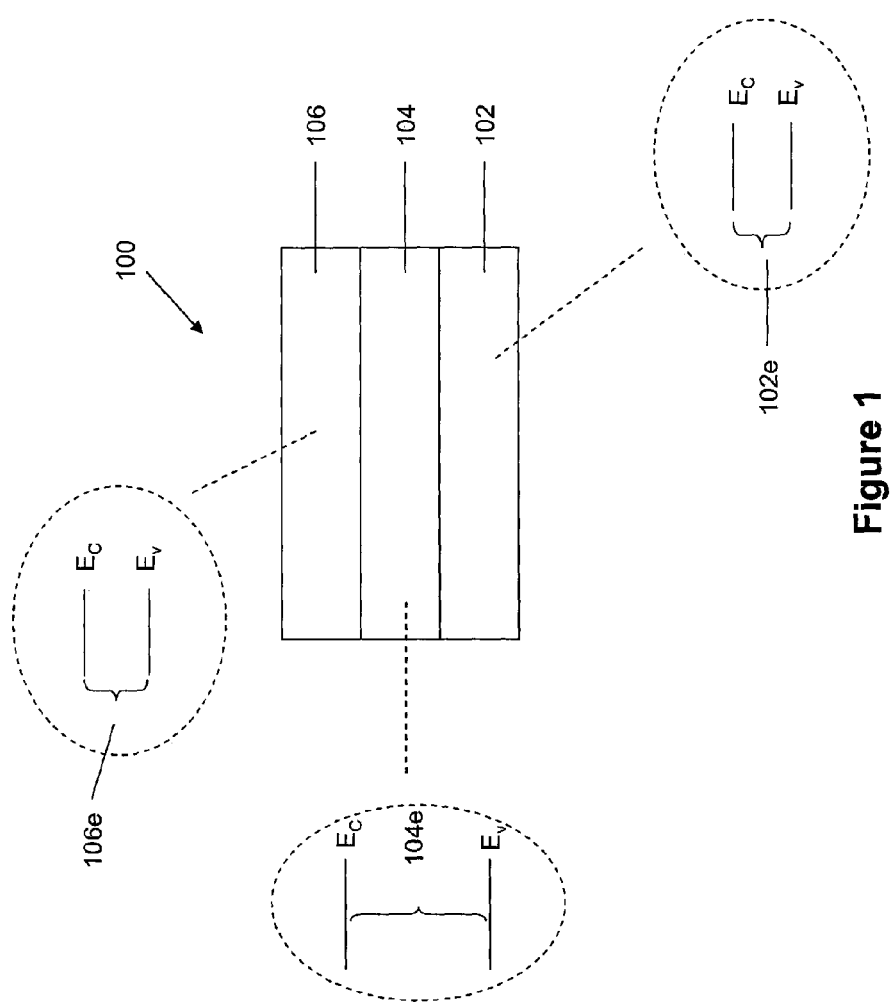
FIG. 1 shows the structure of an avalanche photodiode according to an embodiment.

The following provides sample, but not exhaustive, definitions for expressions used throughout various embodiments disclosed herein.

The term "avalanche photodiode" may refer to a semiconductor electronic device which is operated under reverse bias such that charge carriers (electron-hole pairs) are emitted within the p-n junction of the semiconductor electronic device as a consequence of absorption of energy from light of a certain wavelength. The free charge carriers are subjected to strong acceleration by an electric field, and subsequently collide with other charge carriers of the medium and thereby ionize them in a process called impact ionization. This releases additional charge carriers which are themselves accelerated and collide with further atoms, releasing more charge carriers, in a chain reaction.

The term "semiconductor layer" may mean a region within the avalanche photodiode that determines one or more of the specific absorption bands of the avalanche photodiode, by that region being responsive to light/photons of a particular wavelength. In various embodiments, the semiconductor layer may be fabricated from materials that include silicon (Si), germanium (Ge), gallium arsenide (GaAs), indium gallium arsenide (InGaAs) and indium phosphide (InP).

The term "energy bandgap" is a physical property that is intrinsic to each of the layers found in the avalanche photodiode, such as but not limited to the first semiconductor layer, the second semiconductor layer and the control layer. It refers to the energy that has to be supplied to excite electrons from the valence band to the conduction band in each of these layers. A larger bandgap results in a lower thermal-induced leakage current for a particular junction.

The term "control layer" may mean a third semiconductor layer having an energy bandgap engineered to control the dark current that arises when operating an avalanche photodiode. In various embodiments, the control layer is tuned to reduce the effect of the dark current that arises when a diode is operated under reverse bias (as is the case in an avalanche photodiode). In various embodiments, the control layer has an energy bandgap such that free charge carriers, produced by an adjacent semiconductor layer (such as the first semiconductor layer and the second semiconductor layer) absorbing photons, require more energy to surpass the energy barrier provided by the energy bandgap of the control layer.

The term "suppress" may mean that the control layer presents an energy barrier—at both the junction of the first semiconductor layer and the control layer; and the junction of the control layer and the second semiconductor layer—that prevents carriers from passing through the junction.

The term "dark current" may mean the current that flows through the avalanche photodiode in the absence of light.

DETAILED DESCRIPTION

In the following description, various embodiments are described with reference to the drawings, where like reference characters generally refer to the same parts throughout the different views.

FIG. 1 shows the structure of an avalanche photodiode 100 according to an embodiment.

The avalanche photodiode 100 includes a first semiconductor layer 102 that absorbs photons (not shown) of a first wavelength range and having a first energy bandgap 102$e$ and a second semiconductor layer 106 that absorbs photons (not shown) of a second wavelength range and having a second energy bandgap 106$e$. The second energy bandgap 106$e$ is different from the first energy bandgap 102$e$. The avalanche photodiode 100 thus is able to absorb photons of two different wavelength ranges.

A control layer 104 is disposed between the first semiconductor layer 102 and the second semiconductor layer 106. The control layer 104 has a third energy bandgap 104$e$ and is engineered to suppress carriers created from dark current. The third energy bandgap 104$e$ may be greater than either the first energy bandgap 102$e$ or the second energy bandgap 106$e$. From the perspective of an energy bandgap diagram formed at the junction of the first semiconductor layer 102 and control layer 104, and at the junction of the second semiconductor layer 106 and the control layer 104, the energy bandgap 104$e$ will have a bandgap that is larger than either the first energy bandgap 102$e$ or the second energy bandgap 106$e$. In addition, the third energy bandgap 104$e$ is designed to act as a barrier for photo generated carriers as well as thermal-induced dark current. The third energy bandgap 104$e$ can be controlled by changing the concentration of the elements used to fabricate the control layer 104.

Dark current effect is more prevalent in avalanche photodiode operation, as an avalanche photodiode is operated under higher reverse bias compared to a normal photodiode. Thus, the control layer 104 allows for embodiments of the avalanche photodiode 100 to have low dark current, while being sensitive to photons of the first wavelength range and the second wavelength range.

Figure 2:
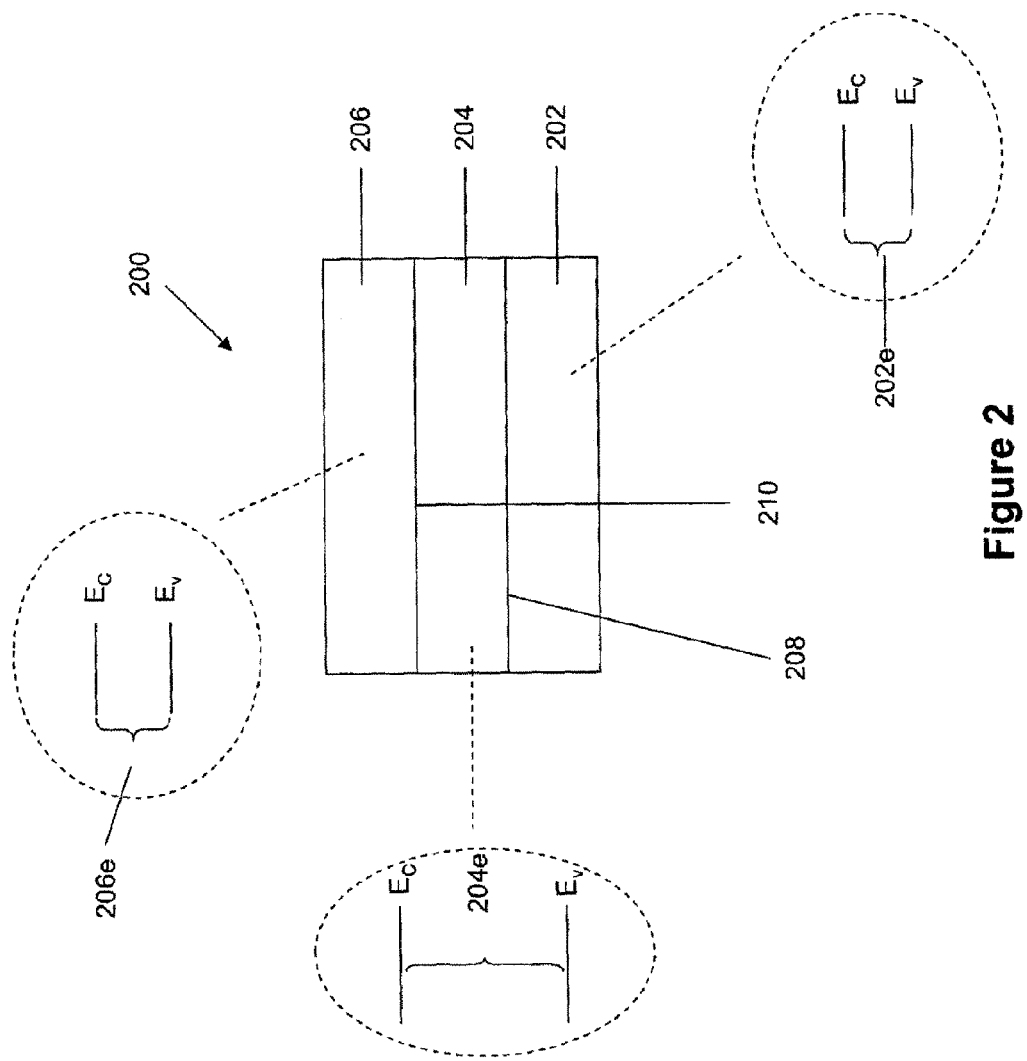
FIG. 2 shows the structure of an avalanche photodiode according to a further embodiment.

FIG. 2 shows the structure of an avalanche photodiode 200 according to a further embodiment.

The avalanche photodiode 200 includes a first semiconductor layer 202 that absorbs photons (not shown) of a first wavelength range and having a first energy bandgap 202$e$ and a second semiconductor layer 206 that absorbs photons (not shown) of a second wavelength range and having a second energy bandgap 206$e$. In various embodiments, the first semiconductor layer 202 is fabricated from a different semiconductor material than the second semiconductor layer 206, so that the second energy bandgap 206$e$ is different from the first energy bandgap 202$e$.

A control layer 204 is disposed between the first semiconductor layer 202 and the second semiconductor layer 206. The control layer 204 serves to block carriers from flowing through laterally.

The control layer 204 has a third energy bandgap 204$e$ and is engineered to suppress carriers created from both dark current and photocurrent, these carriers being generated in one or both of the first semiconductor layer 202 and the second semiconductor layer 206. The third energy bandgap is engineered to allow for a photocurrent with a substantially vertical profile (indicated using reference numeral 706 in FIGS. 7B to 7D) near the breakdown voltage of the avalanche photodiode. The third energy bandgap 204$e$ may also be greater than either the first energy bandgap 202$e$ or the second energy bandgap 206$e$. In addition, the third energy bandgap 204$e$ is designed as a barrier to block dark current.

Similar to the avalanche photodiode 100 of FIG. 1, the avalanche photodiode 200 is able to absorb photons of two different wavelength ranges. In the embodiment shown in FIG. 2, the first wavelength range can be made different from the second wavelength range by fabricating the first semiconductor layer 202 and the second semiconductor layer 206 from different semiconductor materials. The control layer 204 of the avalanche photodiode 200 also allows for embodiments of the avalanche photodiode 200 to have low dark current, while being sensitive to photons of the first wavelength range and the second wavelength range. The control layer 204 also prevents photo generated carriers in the first semiconductor layer 202 from flowing through the junction (formed by the first semiconductor layer 202, the second semiconductor layer 206 and the control layer 204) up to a reverse bias close to the breakdown voltage as shown in FIGS. 7B to 7E, which is desirable for SPAD applications.

The avalanche photodiode 200 may be realised through combining one or more of the following semiconductor materials listed below.

The first semiconductor layer 202 may be a Ge photon absorption layer, so that the first wavelength range of photons that the avalanche photodiode 200 can absorb is typically from around 800 nm to around 1700 nm. The absorption of photons of this first wavelength range occurs within the first semiconductor layer 202.

The second semiconductor layer 206 may be a GaAs photon absorption layer, so that the second wavelength range of photons that the avalanche photodiode 200 can absorb is typically from around 400 nm to around 900 nm. The absorption of photons of this second wavelength range occurs within the second semiconductor layer 206.

When combined with III-V semiconductors, embodiments that use heterogeneous materials that integrate GaAs/Ge are inexpensive when compared to using InGaAs. GaAs/Ge APDs exhibit superior device performance such as low dark current and wide detection range covering both GaAs and Ge response spectra, which are not attainable in photodiodes fabricated from Si, Ge and InGaAs.

In other embodiments, where the avalanche photodiode 200 is to be responsive to photons of a wavelength range that is different from around 800 nm to around 1700 nm, the first semiconductor layer 202 may be fabricated from a material other than Ge. For the other response spectrum, if the avalanche photodiode 200 is to be responsive to photons of a wavelength range that is different from around 400 nm to around 900 nm, the second semiconductor layer 206 may be fabricated from a material other than GaAs.

The control layer 204 may be an $Al_xGa_{1-x}As$ (aluminum gallium arsenide) layer, wherein x is a mole fraction between Al and Ga, where $0 \leq x \leq 1$. $Al_xGa_{1-x}As$ bandgap increases with increasing Al content. A higher Al content results in a lower leakage current. A preferred mole fraction is, for example, $0.3 \leq x \leq 1$.

Ge intrinsically has large leakage current at room temperature due to its narrow bandgap of around 0.66 eV at room temperature. This leakage current can be suppressed by adding the GaAs (which has a larger bandgap of 1.424 eV at room temperature) and the $Al_xGa_{1-x}As$ layers (the bandgap being dependent on the Al content, as explained above) to form a p-i-n junction.

The Ge photon absorption layer used to realise the first semiconductor layer 202 may be doped. For example, the Ge photon absorption layer may be doped with a p-type dopant. The dopant concentration in the Ge photon absorption layer may be less than the dopant concentration of the contact layers (not shown) present in the avalanche photodiode 200.

The GaAs photon absorption layer used to realise the second semiconductor layer 206 may be undoped. However, it is also possible that the GaAs photon absorption layer is doped with a polarity that is the same as the first semiconductor layer 202. Accordingly, when the first semiconductor layer 202 is realised using a p-doped Ge photon absorption layer, the GaAs photon absorption layer is also doped with a p-type dopant. The dopant concentration in the GaAs photon absorption layer may be less than the dopant concentration of the contact layers (not shown) present in the avalanche photodiode 200. The dopant concentration may be the same or different in each of the GaAs photon absorption layer and the Ge photon absorption layer.

The $Al_xGa_{1-x}As$ layer used to realise the control layer 204 may be undoped. However, it is also possible that the $Al_xGa_{1-x}As$ layer is doped with a polarity that is the same as the first semiconductor layer 202. Accordingly, when the first semiconductor layer 202 is realised using a p-doped Ge photon absorption layer, the $Al_xGa_{1-x}As$ is also doped with a p-type dopant. The dopant concentration may be the same or different in each of the $Al_xGa_{1-x}As$ layer and the Ge photon absorption layer.

The combined thickness of the first semiconductor layer 202, the second semiconductor layer 206 and the control layer 204 may be at least 600 nm.

The control layer 204 may act as an interface between the first semiconductor layer 202 and the second semiconductor layer 206, so that a first surface 208 of the control layer 204 is in contact with the first semiconductor layer 202 and a second surface 210 that is opposite to the first surface 208 of the control layer 204 is in contact with the second semiconductor layer 206.

Figure 3A:
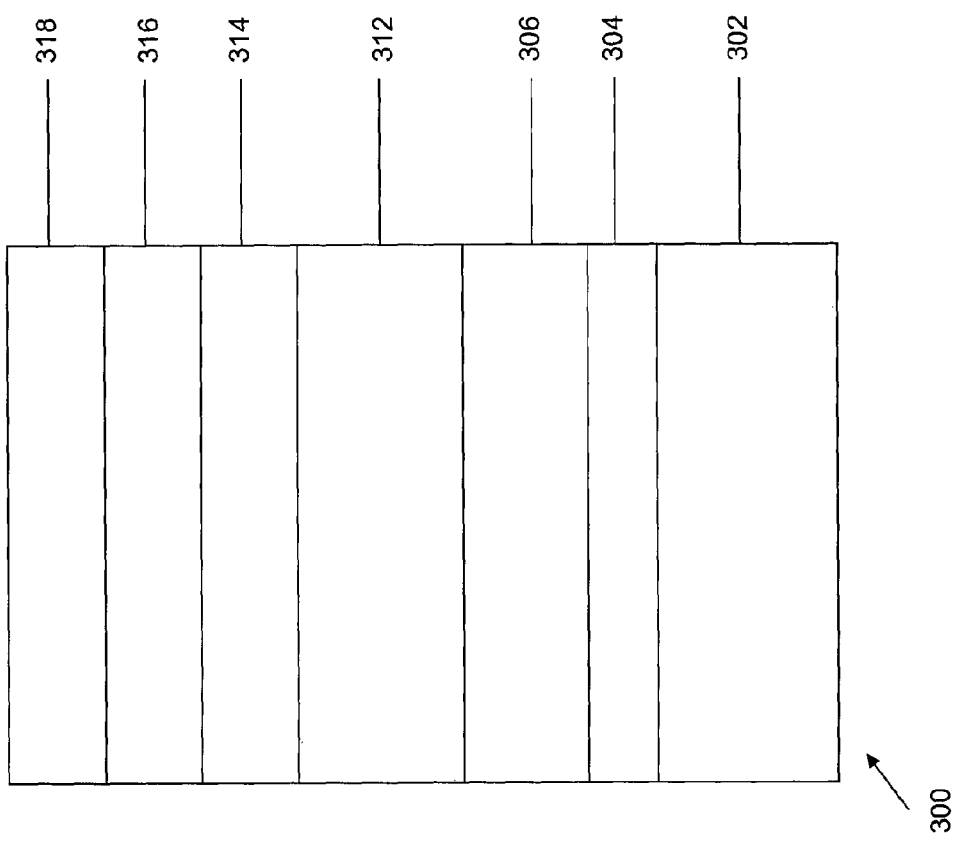
Figure 3B:
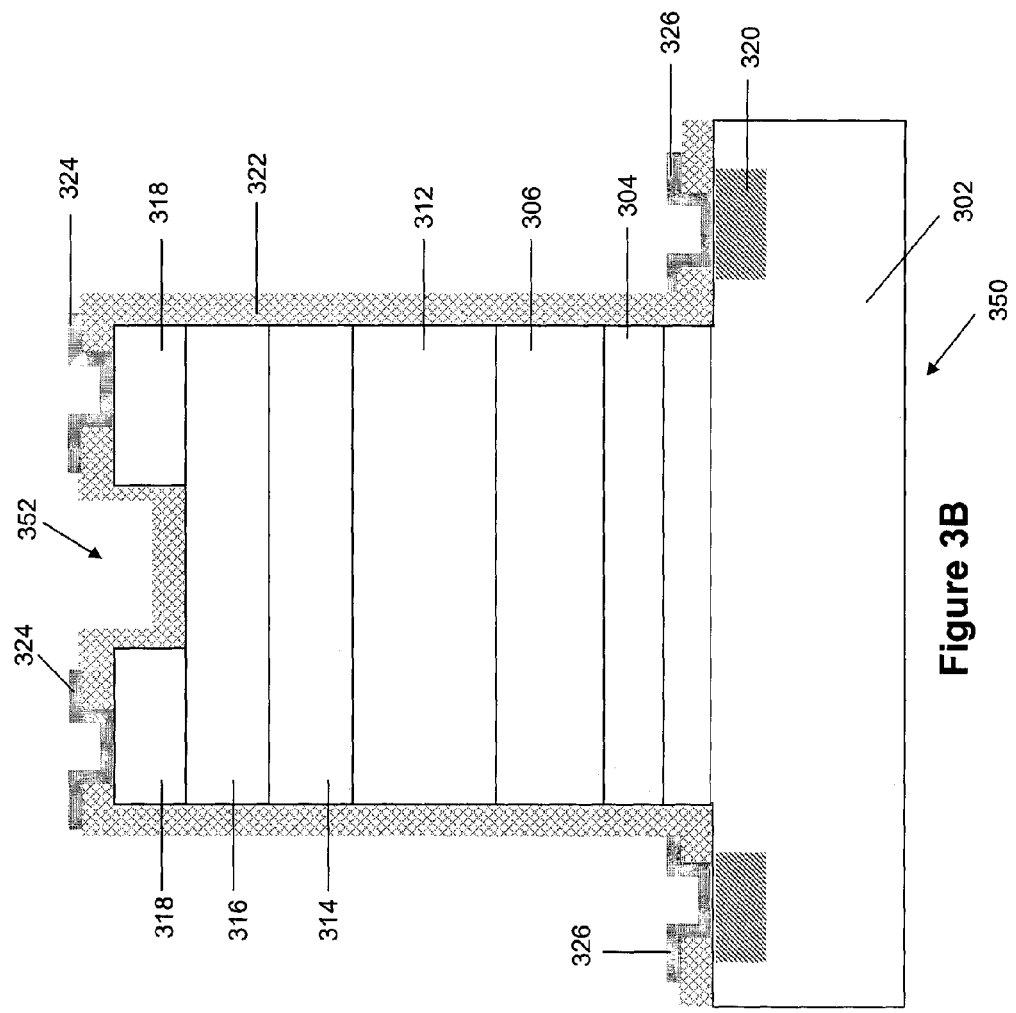
FIG. 3B shows a configuration of an avalanche photodiode which implements the structure of FIG. 3A.

FIG. 3A shows the structure of an avalanche photodiode 300 according to an additional embodiment, while FIG. 3B shows a configuration of an avalanche photodiode 350 which implements the structure of FIG. 3A.

The avalanche photodiode 300/350 includes a first semiconductor layer 302 that absorbs photons (not shown) of a first wavelength range and having a first energy bandgap and a second semiconductor layer 306 that absorbs photons (not shown) of a second wavelength range and having a second energy bandgap. The second energy bandgap is different from the first energy bandgap. The avalanche photodiode 300/350 thus is able to absorb photons of two different wavelength ranges.

A control layer 304 is disposed between the first semiconductor layer 302 and the second semiconductor layer 306. The control layer 304 has a third energy bandgap and is engineered to suppress carriers created from dark current. The third energy bandgap is engineered to allow for a photocurrent with a substantially vertical profile (indicated using reference numeral 706 in FIGS. 7B to 7D) near the breakdown voltage of the avalanche photodiode. The third energy bandgap may be greater than either the first energy bandgap or the second energy bandgap. The control layer 304 allows for the avalanche photodiode 300/350 to have low dark current, while being sensitive to photons of the first wavelength range and the second wavelength range.

For the sake of simplicity, the first energy bandgap, the second energy bandgap and the third energy bandgap are not shown (but refer to FIGS. 1 and 2).

A graded semiconductor layer 312 is disposed on the second semiconductor layer 306. A third semiconductor layer 314 is disposed on the graded semiconductor layer 312, while a fourth semiconductor layer 316 is disposed on the third semiconductor layer 314. A contact layer 318 is disposed on the fourth semiconductor layer 316.

The first semiconductor layer 302 may be a Ge photon absorption, layer sensitive to photons of a wavelength from around 800 nm to around 1700 nm. In the embodiment shown in FIGS. 3A and 3B, the Ge photon absorption layer is a miscut Ge substrate doped with a p-type dopant of concentration around 1.0 to $6.0 \times 10^{17}/cm^3$. In another embodiment, the first semiconductor layer 302 may be realised by a p-doped GeOI (germanium on insulator) miscut substrate.

The control layer 304 may be fabricated from $Al_xGa_{1-x}As$ of content $0 \leq x \leq 1$ and having a thickness 3 nm$\leq t \leq$300 nm. A preferred mole fraction is, for example, 0.3≤x≤1. The control layer 304 may be doped with a p-type dopant of concentration from around 0 to $1.0 \times 10^{18}/cm^3$ (where a concentration level of 0 means that the control layer 304 is undoped).

The second semiconductor layer 306 may be a GaAs absorption layer sensitive to photons of a wavelength from around 400 nm to around 900 nm. The GaAs absorption layer may have a thickness t of around 300 to 2000 nm. The second semiconductor layer 306 may be doped with a p-type dopant of concentration from around 0 to $5.0 \times 10^{17}/cm^3$ (where a concentration level of 0 means that the second semiconductor layer 306 is undoped). When the GaAs absorption layer is undoped or lightly doped, it provides a region where charge carrier multiplication occurs.

The graded semiconductor layer 312 may be a GaAs—$Al_yGa_{1-y}As$ graded undoped layer of content 0≤y≤0.2 and having a thickness t of around 100 to 500 nm. A preferred mole fraction is, for example, 0.05≤y≤0.1. The graded semiconductor layer 312 is used to avoid charge trapping at the interface between differing bandgap materials.

The third semiconductor layer 314 may be an $Al_yGa_{1-y}As$ undoped layer of thickness t of around 100 to 1000 nm, where the y content is the same as that of the graded semiconductor layer 312. The $Al_yGa_{1-y}As$ undoped layer provides a region where charge carrier multiplication occurs.

The fourth semiconductor layer 316 may be an $Al_yGa_{1-y}As$ layer of thickness t from around 300 to 500 nm, doped with a n-type dopant of concentration of around $2.0 \times 10^{18}/cm^3$. The y content is the same as that of the graded semiconductor layer 312. The fourth semiconductor layer 316 is thus doped with a polarity that is opposite to that of the first semiconductor layer 302 and the second semiconductor layer 306. Accordingly, the fourth semiconductor layer 316, along with the first semiconductor layer 302 and the second semiconductor layer 306, form a p-i-n junction of the avalanche photodiode 300 and 350.

The contact layer 318 may be fabricated from GaAs of thickness t from around 50 to 200 nm, that is heavily doped with a n-type dopant of concentration from around 0.5 to $5.0 \times 10^{19}/cm^3$.

With reference to the avalanche photodiode 350, when necessary, a contact region 320 may be formed in the first semiconductor layer 302. The contact region 320 may be doped using p-type dopants, such as Boron or Gallium by diffusion or implantation techniques, at a concentration that is greater than the remainder of the Ge substrate to form a heavily doped Ge p++ contact region.

A dielectric isolation layer 322 may be grown on the avalanche photodiode 350, using a material like silicon dioxide.

An opening may be formed through a portion of the dielectric isolation layer 322 that provides access to the contact layer 318, with the opening provided with an n-type ohmic contact 324 disposed on the contact layer 318. Similarly, another opening may be formed through a portion of the dielectric isolation layer 322 that provides access to the contact region 320, with the opening provided with a p-type ohmic contact 326 disposed on the contact region 320. The n-type ohmic contact 324 may be fabricated from the same material as the p-type ohmic contact 326. Exemplary materials that may be used for the n-type ohmic contact 324 and the p-type ohmic contact 326 include but are not limited to the alloys: AuGe/Ni/Au or Au/Ge/Au/Ni/Au.

The contact layer 318 is provided with an opening 352 that allows ambient light to enter the avalanche photodiode 350, for the avalanche photodiode 350 to absorb photons of the first wavelength range and photons of the second wavelength range.

From the above, FIG. 3A shows a heterojunction photodiode configuration comprising of Ge, GaAs and $Al_xGa_{1-x}As$ layers. FIG. 3B shows a photodiode incorporating the heterojunction photodiode configuration of FIG. 3A constructed on a p-doped Ge miscut substrate or a p-doped GeOI miscut substrate.

Figure 4A:
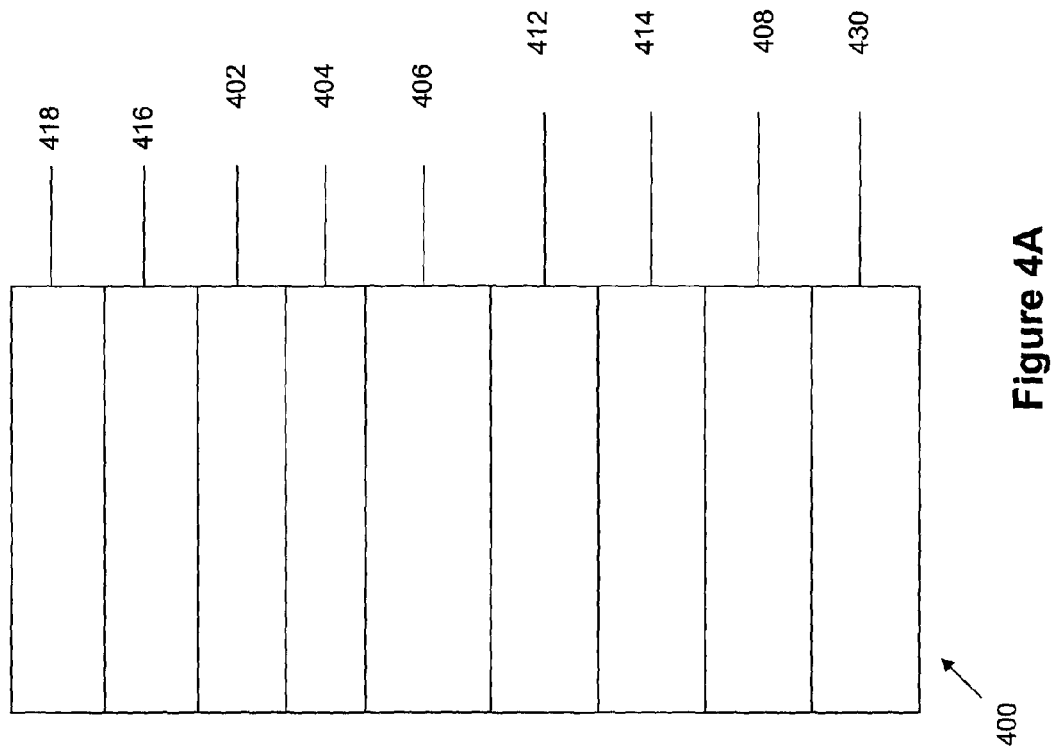
Figure 4B:
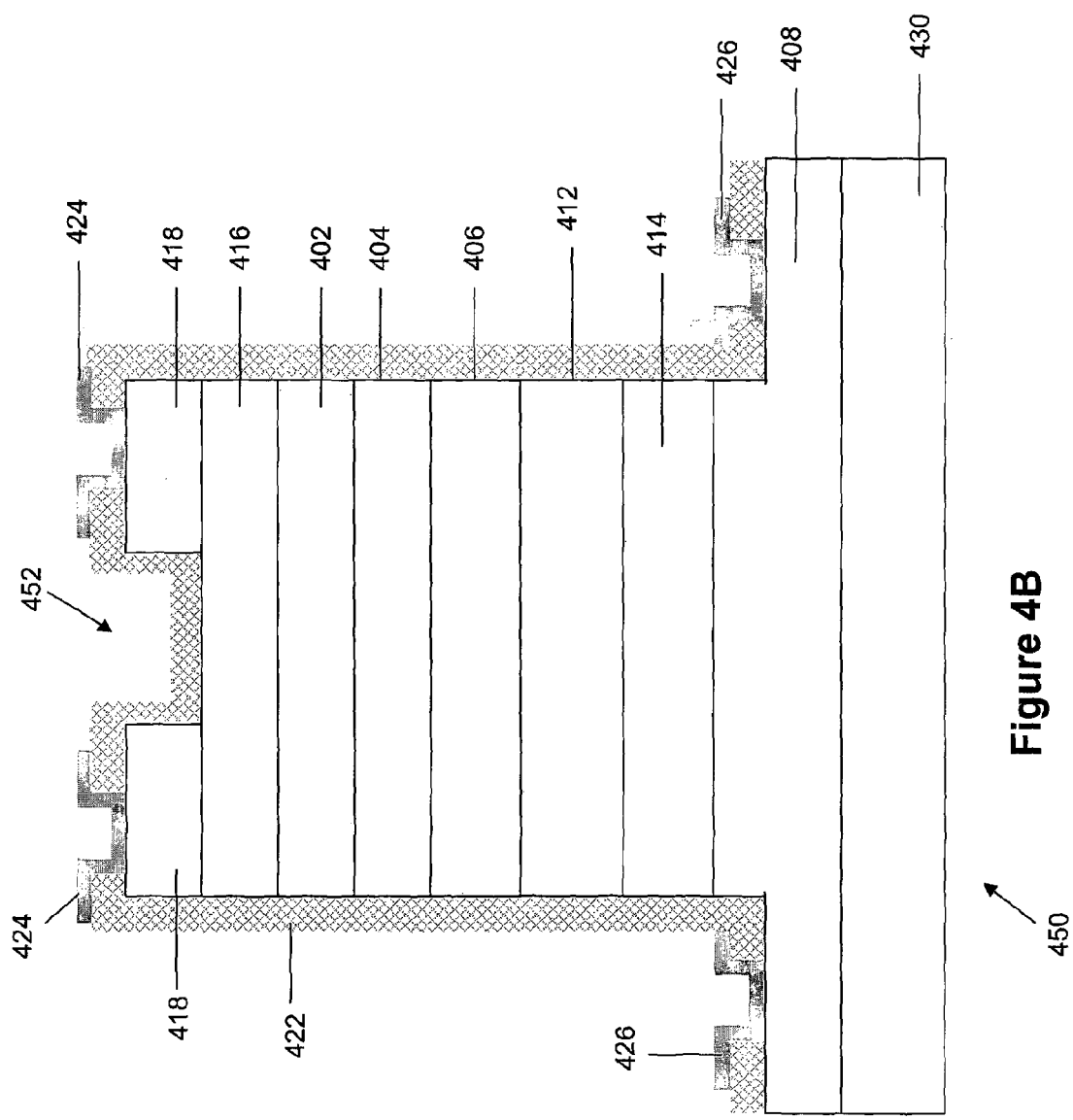
FIG. 4B shows a configuration of an avalanche photodiode which implements the structure of FIG. 4A.

FIG. 4A shows the structure of an avalanche photodiode 400 according to an additional embodiment, while FIG. 4B shows a configuration of an avalanche photodiode 450 which implements the structure of FIG. 4A.

The avalanche photodiode 400/450 includes a first semiconductor layer 402 that absorbs photons (not shown) of a first wavelength range and having a first energy bandgap and a second semiconductor layer 406 that absorbs photons (not shown) of a second wavelength range and having a second energy bandgap. The second energy bandgap is different from the first energy bandgap. The avalanche photodiode 400/450 thus is able to absorb photons of two different wavelength ranges.

A control layer 404 is disposed between the first semiconductor layer 402 and the second semiconductor layer 406. The control layer 404 has a third energy bandgap and the width of the third energy bandgap is engineered to suppress carriers created from dark current. The third energy bandgap is engineered to allow for a photocurrent with a substantially vertical profile (indicated using reference numeral 706 in FIGS. 7B to 7D) near the breakdown voltage of the avalanche photodiode. The third energy bandgap may be greater than either the first energy bandgap or the second energy bandgap. The control layer 404 allows for the avalanche photodiode 400/450 to have low dark current, while being sensitive to photons of the first wavelength range and the second wavelength range.

For the sake of simplicity, the first energy bandgap, the second energy bandgap and the third energy bandgap are not shown (but refer to FIGS. 1 and 2).

The layer arrangement of the avalanche photodiode 400/450 is different from that of the avalanche photodiode 300/350 shown in FIGS. 3A and 3B in the following ways. The order of the first semiconductor layer 402, the control layer 404 and the second semiconductor layer 406 of the avalanche photodiode 400/450 is reverse to that of the first semiconductor layer 302, the control layer 304 and the second semiconductor layer 306 found in the avalanche photodiode 300/350 shown in FIGS. 3A and 3B. In the avalanche photodiode 300/350, the first semiconductor layer 302 is the substrate (i.e. the base) of the avalanche photodiode 300/350. In contrast, the first semiconductor layer 402 of the avalanche photodiode 400/450 is one of the layers above substrate 430 of the avalanche photodiode 400/450. The first semiconductor layer 402 is the first layer within the arrangement of the first semiconductor layer 402, the control layer 404 and the second semiconductor layer 406 to encounter photons from the surface of the avalanche photodiode 450 that is exposed to receive incident light. In contrast, the first semiconductor layer 302 is the last layer within the arrangement of the first semiconductor layer 302, the control layer 304 and the second semiconductor layer 306 to encounter photons from the surface of the avalanche photodiode 350 that is exposed to receive incident light.

The second semiconductor layer 406 is disposed on a graded semiconductor layer 412. The graded semiconductor layer 412 is disposed on a third semiconductor layer 414. A fourth semiconductor layer 416 is disposed on the first semiconductor layer 402. A contact layer 418 is disposed on the fourth semiconductor layer 416. A fifth semiconductor layer 408 may be disposed between the substrate 430 and the third semiconductor layer 414.

The first semiconductor layer 402 may be a Ge photon absorption layer sensitive to photons of a wavelength from around 800 nm to around 1700 nm. The Ge photon absorption layer may have a thickness t of around 20 to 2000 nm. In the embodiment shown in FIGS. 4A and 4B, the Ge photon absorption layer may be doped with a p-type dopant of concentration around 0 to 1.0 to $5.0 \times 10^{17}/cm^3$ (where a concentration level of 0 means that the first semiconductor layer 402 is undoped).

The control layer 404 may be fabricated from $Al_xGa_{1-x}As$ of content $0 \leq x \leq 1$ and having a thickness t of from around 3 nm to 50 nm. A preferred mole fraction is, for example, $0.3 \leq x \leq 1$. The control layer 404 may be doped with a p-type dopant of concentration from around 0 to $1.0 \times 10^{18}/cm^3$ (where a concentration level of 0 means that the control layer 404 is undoped).

The second semiconductor layer 406 may be a GaAs absorption layer sensitive to photons of a wavelength from around 400 nm to around 900 nm. The GaAs absorption layer may have a thickness t of around 300 to 2000 nm. The second semiconductor layer 406 may be doped with a p-type dopant of concentration from around 0 to $5.0 \times 10^{17}/cm^3$ (where a concentration level of 0 means that the second semiconductor layer 406 is undoped). When the GaAs absorption layer is undoped or lightly doped, it provides a region where charge carrier multiplication occurs.

The graded semiconductor layer 412 may be a GaAs—$Al_yGa_{1-y}As$ graded undoped layer of content $0 \leq y \leq 0.2$ and having a thickness t of around 100 to 500 nm. A preferred mole fraction is, for example, $0.05 \leq y \leq 0.1$. The graded semiconductor layer 412 is used to avoid charge trapping at the interface between differing bandgap materials.

The third semiconductor layer 414 may be an $Al_yGa_{1-y}As$ undoped layer of thickness t of around 100 to 1000 nm, where the y content is the same as that of the graded semiconductor layer 412. The $Al_yGa_{1-y}As$ undoped layer provides a region where charge carrier multiplication occurs.

The fourth semiconductor layer 416 may be an $Al_yGa_{1-y}As$ layer of thickness t from around 300 to 500 nm, doped with a p-type dopant of concentration of around $2.0 \times 10^{18}/cm^3$. The y content is the same as that of the graded semiconductor layer 412. The fourth semiconductor layer 416 is thus doped with a polarity that is the same as both the first semiconductor layer 402 and the second semiconductor layer 406.

The fifth semiconductor layer 408 may be an $Al_yGa_{1-y}As$ layer of content $0 \leq y \leq 0.2$, having a thickness t from around 300 to 500 nm and heavily doped with a n-type dopant of concentration of around $2.0 \times 10^{18}/cm^3$. The fifth semiconductor layer 408 is thus doped with a polarity that is opposite to both the first semiconductor layer 402 and the second semiconductor layer 406.

The substrate 430 may be fabricated from GaAs which is undoped or doped with a n-type dopant of concentration from around 1.0 to $3.0 \times 10^{18}/cm^3$.

The fourth semiconductor layer 416, the first semiconductor layer 402, the control layer 404, the second semiconductor layer 406, and the fifth semiconductor layer 408 form a p-i-n junction of the avalanche photodiode 400 and 450.

The contact layer 418 may be fabricated from GaAs of thickness t from around 50 to 200 nm, that is heavily doped with a p-type dopant of concentration from around 0.5 to $5.0 \times 10^{19}/cm^3$.

A dielectric isolation layer 422 may be grown on the avalanche photodiode 450, using a material like silicon dioxide.

An opening may be formed through a portion of the dielectric isolation layer 422 that provides access to the contact layer 418, with the opening provided with a p-type ohmic contact 424 disposed on the contact layer 418. Similarly, another opening may be formed through a portion of the dielectric isolation layer 422 that provides access to the fifth semiconductor layer 408, with the opening provided with an n-type ohmic contact 426 disposed on the fifth semiconductor layer 408. The p-type ohmic contact 424 may be fabricated from the same material as the n-type ohmic contact 426. Exemplary materials that may be used for the p-type ohmic contact 424 and the n-type ohmic contact 426 include but are not limited to the alloys: AuGe/Ni/Au or Au/Ge/Au/Ni/Au.

The contact layer 418 is provided with an opening 452 that allows ambient light to enter the avalanche photodiode 450, for the avalanche photodiode 450 to absorb photons of the first wavelength range and photons of the second wavelength range.

From the above, FIG. 4A shows a heterojunction photodiode configuration comprising of Ge, GaAs and $Al_xGa_{1-x}As$ layers. FIG. 4B shows a photodiode incorporating the heterojunction photodiode configuration of FIG. 4A constructed on a n-doped or undoped GaAs substrate.

Figure 5B:
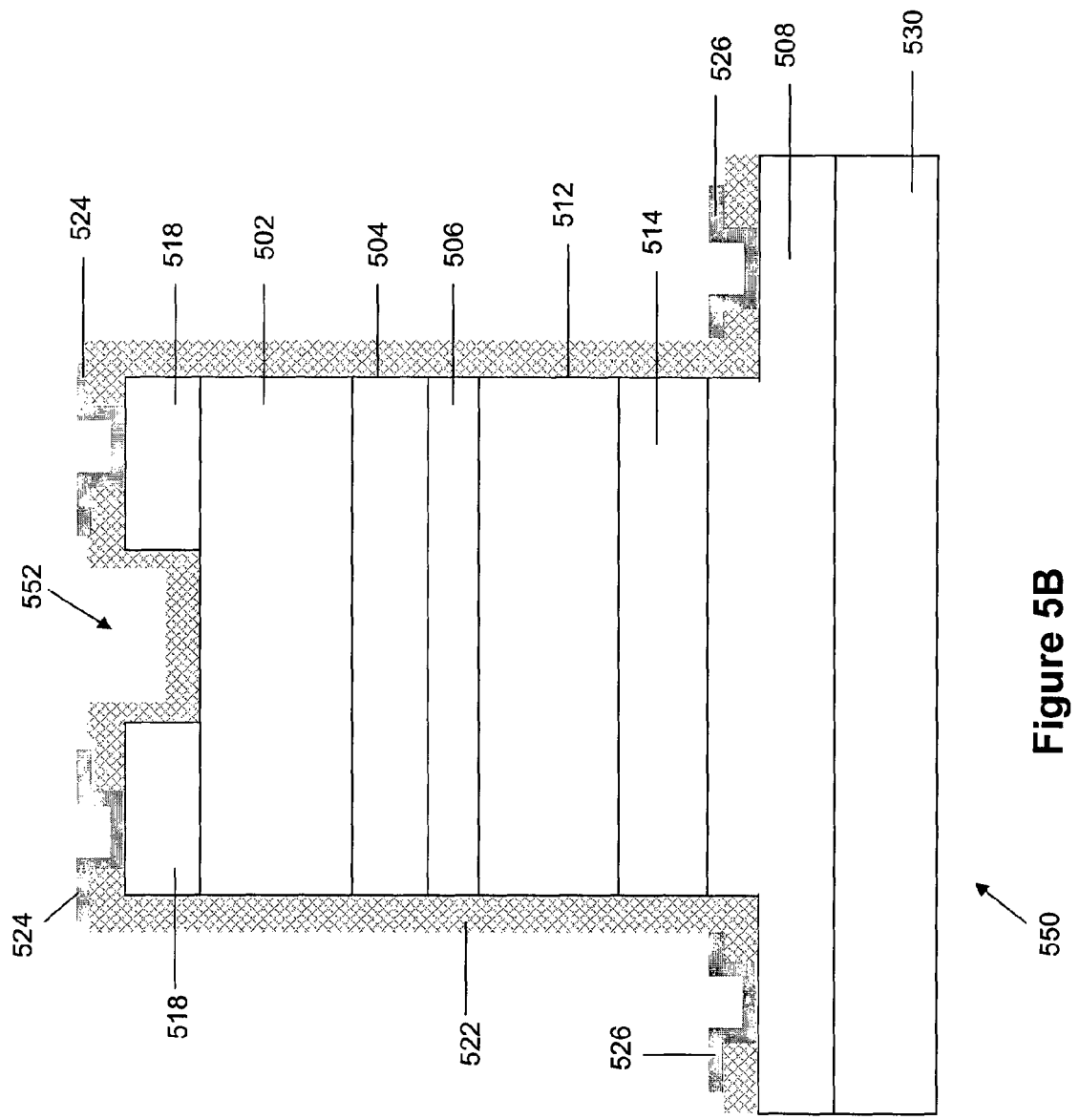
FIG. 5B shows a configuration of an avalanche photodiode which implements the structure of FIG. 5A.

FIG. 5A shows the structure of an avalanche photodiode 500 according to an additional embodiment, while FIG. 5B shows a configuration of an avalanche photodiode 550 which implements the structure of FIG. 5A.

The avalanche photodiode 500/550 includes a first semiconductor layer 502 that absorbs photons (not shown) of a first wavelength range and having a first energy bandgap and a second semiconductor layer 506 that absorbs photons (not shown) of a second wavelength range and having a second energy bandgap. The second energy bandgap is different from the first energy bandgap. The avalanche photodiode 500/550 thus is able to absorb photons of two different wavelength ranges.

A control layer 504 is disposed between the first semiconductor layer 502 and the second semiconductor layer 506. The control layer 504 has a third energy bandgap and the width of the third energy bandgap is engineered to suppress carriers created from dark current. The third energy bandgap is engineered to allow for a photocurrent with a substantially vertical profile (indicated using reference numeral 706 in FIGS. 7B to 7D) near the breakdown voltage of the avalanche photodiode. The third energy bandgap may be greater than either the first energy bandgap or the second energy bandgap. The control layer 504 allows for the avalanche photodiode 500/550 to have low dark current, while being sensitive to photons of the first wavelength range and the second wavelength range.

For the sake of simplicity, the first energy bandgap, the second energy bandgap and the third energy bandgap are not shown (but refer to FIGS. 1 and 2).

The layer arrangement of the avalanche photodiode 500/550 is different from that of the avalanche photodiode 300/350 shown in FIGS. 3A and 3B in the following ways. The order of the first semiconductor layer 502, the control layer 504 and the second semiconductor layer 506 of the avalanche photodiode 500 is reverse to that of the first semiconductor layer 302, the control layer 304 and the second semiconductor layer 306 found in the avalanche photodiode 300/350 shown in FIGS. 3A and 3B. In the avalanche photodiode 300/350, the first semiconductor layer 302 is the substrate (i.e. the base) of the avalanche photodiode 300/350. In contrast, the first semiconductor layer 502 of the avalanche photodiode 500/550 is one of the layers above substrate 530 of the avalanche photodiode 500/550. The first semiconductor layer 502 is the first layer within the arrangement of the first semiconductor layer 502, the control layer 504 and the second semiconductor layer 506 to encounter photons from the surface of the avalanche photodiode 550 that is exposed to receive incident light. In contrast, the first semiconductor layer 302 is the last layer within the arrangement of the first semiconductor layer 302, the control layer 304 and the second semiconductor layer 306 to encounter photons from the surface of the avalanche photodiode 350 that is exposed to receive incident light.

The second semiconductor layer 506 is disposed on a graded semiconductor layer 512. The graded semiconductor layer 512 is disposed on a third semiconductor layer 514. A contact layer 518 is disposed on the first semiconductor layer 502. A fourth semiconductor layer 508 may be disposed between the substrate 530 and the third semiconductor layer 514.

The first semiconductor layer 502 may be a Ge photon absorption layer sensitive to photons of a wavelength from around 800 nm to around 1700 nm. The Ge photon absorption layer may have a thickness t of around 20 to 2000 nm. In the embodiment shown in FIGS. 5A and 5B, the Ge photon absorption layer may be doped with a p-type dopant of concentration around 0 to 1.0 to $5.0\times10^{17}/cm^3$ (where a concentration level of 0 means that the first semiconductor layer 502 is undoped).

The control layer 504 may be fabricated from $Al_xGa_{1-x}As$ of content $0\leq x\leq 1$ and having a thickness t of from around 3 nm to 50 nm. A preferred mole fraction is, for example, $0.3\leq x\leq 1$. The control layer 504 may be doped with a p-type dopant of concentration from around 0 to $1.0\times10^{18}/cm^3$ (where a concentration level of 0 means that the control layer 504 is undoped).

The second semiconductor layer 506 may be a GaAs absorption layer sensitive to photons of a wavelength from around 400 nm to around 900 nm. The GaAs absorption layer may have a thickness t of around 300-2000 nm. The second semiconductor layer 506 may be doped with a p-type dopant of concentration from around 0 to $5.0\times10^{17}/cm^3$ (where a concentration level of 0 means that the second semiconductor layer 506 is undoped). When the GaAs absorption layer is undoped or lightly doped, it provides a region where charge carrier multiplication occurs.

The graded semiconductor layer 512 may be a GaAs—$Al_yGa_{1-y}As$ graded undoped layer of content $0\leq y\leq 0.2$ and having a thickness t of around 100 to 500 nm. A preferred mole fraction is, for example, $0.05\leq y\leq 0.1$. The graded semiconductor layer 512 is used to avoid charge trapping at the interface between differing bandgap materials.

The third semiconductor layer 514 may be an $Al_yGa_{1-y}As$ undoped layer of thickness t of around 100 to 1000 nm, where the y content is the same as that of the graded semiconductor layer 512. The $Al_yGa_{1-y}As$ undoped layer provides a region where charge carrier multiplication occurs.

The fourth semiconductor layer 508 may be an $Al_yGa_{1-y}As$ layer of content $0\leq y\leq 0.2$, having a thickness t from around 300 to 500 nm and heavily doped with a n-type dopant of concentration of around $2.0\times10^{18}/cm^3$. The fourth semiconductor layer 508 is thus doped with a polarity that is opposite to both the first semiconductor layer 502 and the second semiconductor layer 506.

The substrate 530 may be fabricated from GaAs which is undoped or doped with a n-type dopant of concentration from around 1.0 to $3.0\times10^{18}/cm^3$.

The first semiconductor layer 502, the control layer 504, the second semiconductor layer 506, and the fourth semiconductor layer 508 form a p-i-n junction of the avalanche photodiode 500 and 550.

The contact layer 518 may be fabricated from GaAs of thickness t from around 50 to 200 nm, that is heavily doped with a p-type dopant of concentration from around 0.5 to $5.0\times10^{19}/cm^3$.

A dielectric isolation layer 522 may be grown on the avalanche photodiode 550, using a material like silicon dioxide.

An opening may be formed through a portion of the dielectric isolation layer 522 that provides access to the contact layer 518, with the opening provided with a p-type ohmic contact 524 disposed on the contact layer 518. Similarly, another opening may be formed through a portion of the dielectric isolation layer 522 that provides access to the fourth semiconductor layer 508, with the opening provided with an n-type ohmic contact 526 disposed on the fourth semiconductor layer 508. The p-type ohmic contact 524 may be fabricated from the same material as the n-type ohmic contact 526. Exemplary materials that may be used for the p-type ohmic contact 524 and the n-type ohmic contact 526 include but are not limited to the alloys: AuGe/Ni/Au or Au/Ge/Au/Ni/Au.

The contact layer 518 is provided with an opening 552 that allows ambient light to enter the avalanche photodiode 550, for the avalanche photodiode 550 to absorb photons of the first wavelength range and photons of the second wavelength range.

From the above, FIG. 5A shows a heterojunction photodiode configuration comprising of Ge, GaAs and $Al_xGa_{1-x}As$ layers. FIG. 5B shows a photodiode incorporating the heterojunction photodiode configuration of FIG. 5A constructed on a n-doped or undoped GaAs substrate.

Embodiments (such as those shown in FIGS. 3 to 5) provide for devices that allow spectral detection below and above 1 um, such as 400 to 1700 nm. Embodiments also show high sensitivity of >30 A/W at reverse bias voltage V=Vbr−2V, especially at the telecommunication wavelengths of 850 nm and 1260 to 1675 nm, which are shown below in table 1.

TABLE 1

Communication bands and their respective wavelength range

| Band | Description | Wavelength Range | Conventional Receiver |
|---|---|---|---|
| Datacom band | First telecom window | 800 to 900 nm | Si; GaAs |
| O band | Original | 1260 to 1360 nm | Ge; InGaAs/InP |
| E band | Extended | 1360 to 1460 nm | Ge; InGaAs/InP |
| S band | short wavelengths | 1460 to 1530 nm | Ge; InGaAs/InP |
| C band | conventional | 1530 to 1565 nm | Ge; InGaAs/InP |
| L band | long wavelengths | 1565 to 1625 nm | Ge; InGaAs/InP |
| U band | ultralong wavelengths | 1625 to 1675 nm | Ge; InGaAs/InP |

The above table shows that existing technology systems use different materials for detection of different wavelengths, which is expensive. Embodiments provide a cheaper solution to the existing technologies, where a single device, according to various embodiments, can replace both Si- and InGaAs-based APDs. The need to produce different types of structure and device is eliminated, hence simplifying production procedures and reducing production cost. Embodiments can be scaled up to larger wafer size for further cost effectiveness.

Various embodiments also provide devices that operate with low dark current and are sensitive over a wide range of wavelength, covering the Ge and GaAs response spectrum of 400 to 1700 nm.

Various embodiments are used in applications such as a pin diode, an avalanche photodiode or a single photon (Geiger-mode) avalanche photodiode, by choosing the appropriate reverse bias voltage range for each of the applications.

For instance, when operated below breakdown voltage, embodiments provide for an avalanche photodiode for weak incident light detection. Applications that use such avalanche photodiodes (including pin diodes) are for example receivers for data and telecommunications (optical fiber communications), range finding, imaging, high-speed laser scanners, laser microscopy, and optical time domain reflectometry.

When operated above breakdown voltage, embodiments provide for a highly sensitive avalanche photodiode for single photon detection (i.e. operation in single photon avalanche diode, SPAD, mode).

SPADs may be used in applications where extremely high sensitivity is required, such as in quantum cryptography, time-resolved photon counting, deep space laser communication, single-photon 3D imaging via time-resolved detection and eye-safe laser ranging. Quantum cryptography (Quantum Key Distribution, QKD) allows two remote parties to generate a secret key, with privacy guaranteed by quantum mechanics (the physical layer is made of single-photon sources, optical fibers and single-photon detectors at 1550 nm). Eye-safe laser ranging (Light Detection And Ranging, LIDAR, the optical radar) measures the distance of an object by means of the estimation of time-of-flight of optical pulses, including satellite laser ranging.

Single photon detection is also useful for VLSI circuit optical characterization and testing based on the measurement of the spontaneous photon emission due to hot-carriers of switching MOSFETs. SPADs may also be used in techniques such as time-resolved spectroscopy, small signal fluorescence detection, fluorescence decay analysis and Raman spectroscopy, which requires high quantum efficiency, low noise and low time jitter single photon detectors for the wavelength>1000 nm. Dosimetry technique may use SPAD during photodynamic therapy (PDT) for singlet oxygen detection for cancer cure.

A SPAD, according to an embodiment, may use an electronic quenching circuit to reduce the voltage at the diode below the threshold voltage for a short time to quench the avalanche process. After a breakdown has been quenched, the time needed before the detector is ready for subsequence detection of further photons is limited by the detector's capacitance and the individual quenching resistor, i.e. the RC time constant (t~RC). After pulses can prolong the recovery time because recharging starts anew. Thus, SPADs according to various embodiments may need hundreds of ns after breakdown until the amplitude of a second signal reaches 95% of the first signal, whereby detector count rate is limited to the order of 10 MHz. For faster operations (such as the GHz range), photodiodes according to various embodiments, should be operated in APD mode.

FIGS. 6A to 6L show an exemplary process to fabricate an avalanche photodiode (APD) according to various embodiments. The avalanche photodiode can be fabricated using, for example a standard photolithography process, as disclosed below.

FIG. 6A: Wafer Cleaning

A heterojunction structure 600 is provided. The heterojunction structure 600 includes a substrate 602 (to depict reference numerals 302, 430 and 530 of FIGS. 3A, 4A and 5A respectively) and a stack of semiconductor layers 604 (to collectively depict reference numerals 304, 306, 312, 314, 316 and 318 of FIG. 3A; reference numerals 428, 402, 404 and 406 of FIG. 4A; and reference numerals 506, 504, 502 and 518 of FIG. 5A). The heterojunction structure 600 can be fabricated using techniques including but not limited to Molecular-Beam Epitaxy (MBE), Metal-Organic Chemical Vapor Deposition (MOCVD), Pulsed Laser Deposition (PLD), Liquid Phase Epitaxy (LPE), Chemical Vapor Deposition (CVD), sputtering and combinations thereof.

The sample surface 602 is cleaned using chemical solutions. For example, first, the sample surface 602 is cleaned using acetone for about 3 minutes in an ultrasonic bath, and then repeated using methanol and isopropyl alcohol (IPA). The sample surface 602 is rinsed in deionised (DI) water for about 1 minute and blown dry using a $N_2$ gun.

FIG. 6B: Depositing $SiO_2$ Film Using PECVD

A dielectric film 605 (for example $SiO_2$) with a thickness of about 200 to 400 nm is deposited using, for example, plasma-enhanced chemical vapor deposition (PECVD).

FIG. 6C: Spin Coating Photoresist (PR)

A resist 606 is applied to the surface of the dielectric layer 604 using e.g. a spin-coating machine. The resist 606 is then pre-baked, where the sample is gently heated in a convection oven and then on a hotplate to evaporate the resist solvent and to partially solidify the resist 606.

FIGS. 6D to 6F: Transferring the APD Photomask Pattern

A photomask 608 is brought into contact or in proximity contact with the resist 606. During a UV exposure process (shown as reference numeral 660 in FIG. 6E), the positive resist 606 undergoes a chemical reaction and leaves a negative image of the mask 608 pattern after being immersed in a developer. The sample can undergo a post-bake process to further harden the resist 606 and to remove any residue of the developer.

Figure 6I:
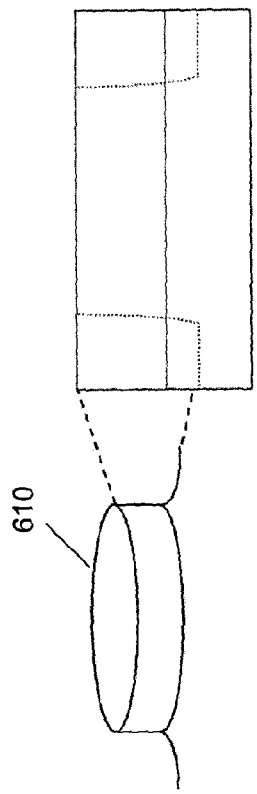
Figure 6G:
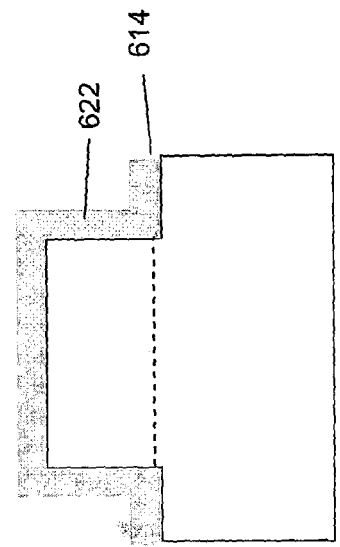

FIG. 6G: Transferring PR Pattern onto $SiO_2$

Using a wet chemical etch, e.g. a buffered hydrofluoric (BHF) etch, the dielectric film 605 is selectively removed. The remaining resist is then removed using a resist solvent.

Figure 6J:
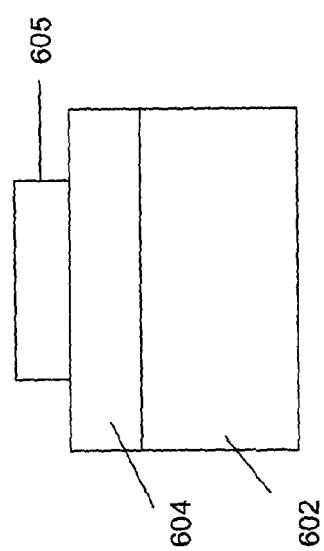
Figure 6H:
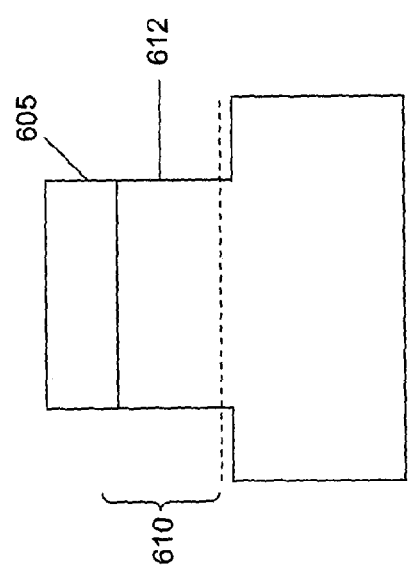

FIG. 6H: Forming Mesa Diodes

The dielectric film 605 pattern is used as a hard mask for etching of the semiconductor materials 610 to form mesa structures 612. This can be done using dry etching, e.g. inductively coupled plasma (ICP) etching, or wet (chemical) etching. After the mesa structures 612 have been formed, the dielectric film 605 is removed, see FIG. 6I.

FIG. 6J: Dielectric and/or Antireflection Coating

A dielectric (eg. $SiO_2$ or $SiN_x$) layer 622 and/or an antireflection coating (eg. $SiO_2/SiN_x$), indicated at numeral 614, are then deposited using PECVD for isolation and to minimize the light reflection at the wavelengths of interest.

Figure 6K:
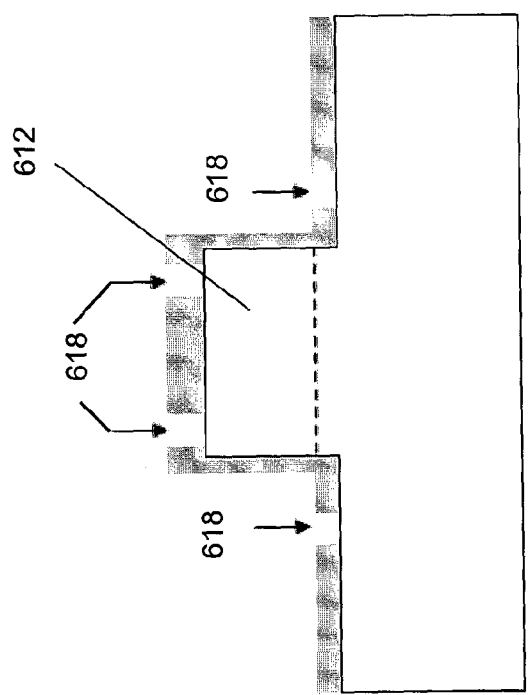
Figure 6L:
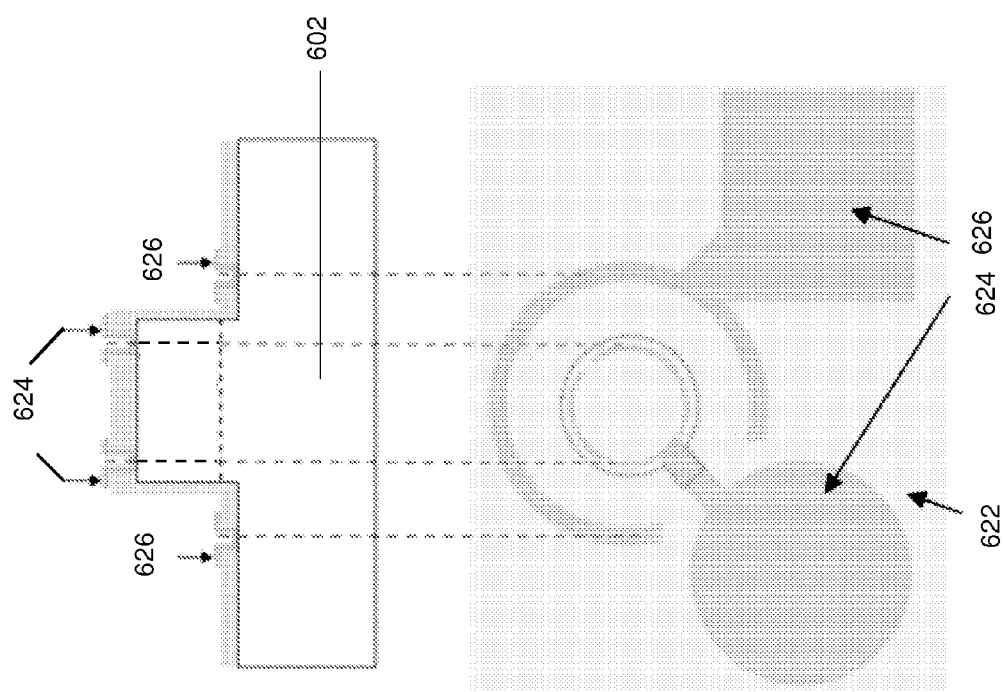

FIGS. 6K to L: Contact Windows Opening

Using a photomask (not shown) designed for contact windows, patterns for metal contacts on the mesa structures 612 can be formed by repeating the patterning steps as described above with reference to FIGS. 6(c) to (g). Openings 618 for the ohmic contacts can be formed together for both n-type and p-type contacts in example embodiments of the present invention. Both p-type and n-type ohmic contacts can be formed at the same time because the same ohmic contact recipe for n-type GaAs ohmic contact can be used for p-type Ge ohmic contact. Conventionally, the ohmic contacts for n-type and p-type need to be formed separately for homojunction photodiodes, where additional processing steps are required.

In order to form and isolate the contacts 624 and 626, a photomask for lift off is used by repeating the photoresist patterning steps as described above with reference to FIGS. 6C to F. The resist (not shown) is then removed in a solvent after contact metallization using for example e-beam metallization, leaving the contacts 624 and 626 in isolation as illustrated in FIG. 6L, which shows the cross-sectional and top views of the final fabricated device of example embodiments. A rapid thermal annealing process can then be performed to minimize the contact resistance.

While one process has been shown, those skilled in the art will realise that one or more of the steps mentioned above may be performed using other suitable techniques. For instance, the dielectric film 605 may be deposited using sputtering. A negative resist may be used, instead of the positive resist 606.

Figure 7A:
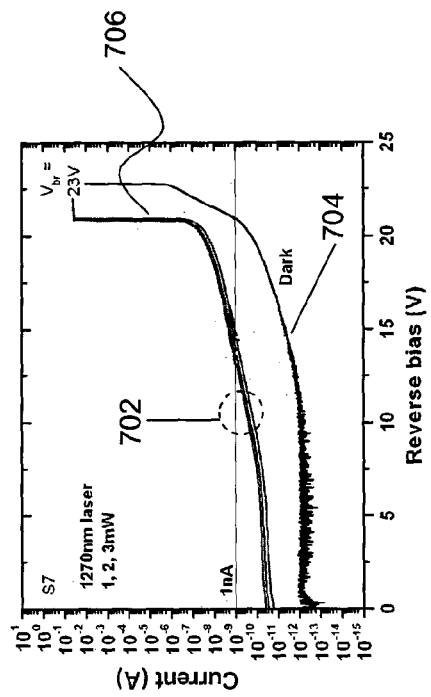
FIGS. 7A to 7E show the photoresponse of a photodiode, according to an embodiment using a Ge/AlGaAs/GaAs heterojunction, at various wavelengths measured at room temperature.
Figure 7B:
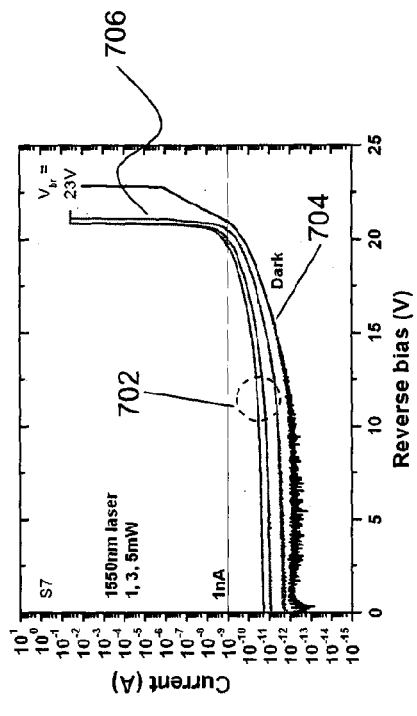
Figure 7C:
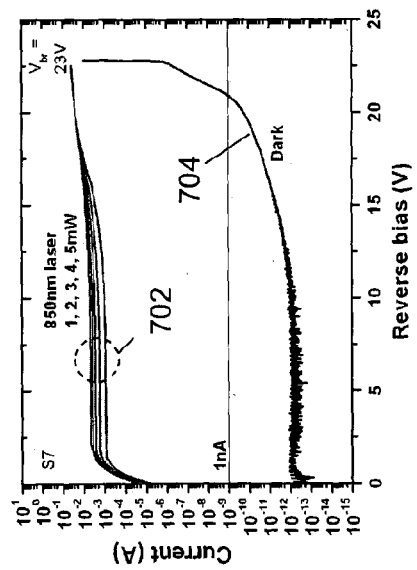
Figure 7D:
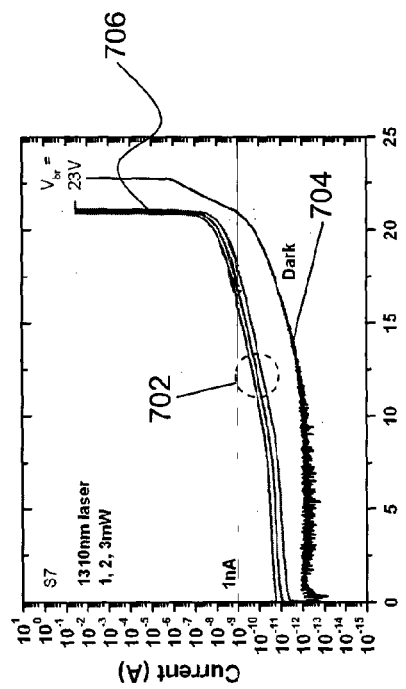
Figure 7E:
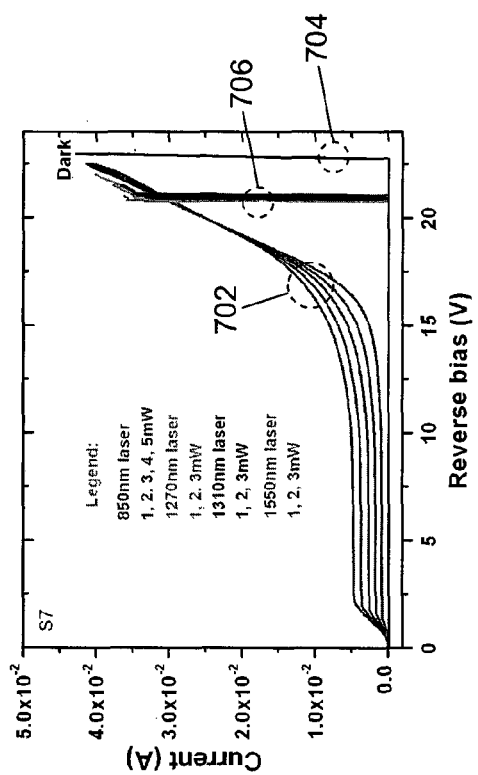

FIGS. 7A to 7E show the photoresponse of a photodiode, according to an embodiment using a Ge/AlGaAs/GaAs heterojunction, at various wavelengths measured at room temperature. FIG. 7A shows the photoresponse of the photodiode to a laser having an emission wavelength of around 850 nm, 7B a laser having an emission wavelength of around 1270 nm, 7C a laser having an emission wavelength of around 1310 nm and 7D a laser having an emission wavelength of around 1550 nm. FIG. 7E combines the results shown in FIGS. 7A to 7D for comparison purposes.

For each of the FIGS. 7A to 7D, reference numeral 702 shows the photocurrent generated when the photodiode detects laser of different power levels, but emitting at the respective wavelength of 850, 1270, 1310 and 1550 nm. Reference numeral 704 is used to denote the dark current present in the photodiode during the photoresponse test. In FIG. 7A, the photocurrent 702 is plotted for the 850 nm laser operating at 1, 2, 3, 4 and 5 mW. In FIG. 7B, the photocurrent 702 is plotted for the 1270 nm laser operating at 1, 2 and 3 mW. In FIG. 7C, the photocurrent 702 is plotted for the 1310 nm laser operating at 1, 2 and 3 mW. In FIG. 7D, the photocurrent 702 is plotted for the 1550 nm laser operating at 1, 3 and 5 mW.

Very high photoresponsivity of >30 A/W is obtained at all wavelengths (850, 1270, 1310 and 1550 nm) at reverse bias>21V. As indicated by reference numeral 706, the photocurrent has a substantially vertical profile near the breakdown voltage of the avalanche photodiode. This is promising for APD applications as usually a high photoresponsivity of >10 A/W is desirable. The very high responsivity near the breakdown voltage is promising for SPAD (single photon avalanche photodiode) applications as it ensures photons at these wavelengths can efficiently photogenerate the "seed" electron-hole pair for avalanche process in single photon detection.

The photoresponse for wavelengths 1270, 1310 and 1550 nm below 21V is low because electrons from the Ge layer are blocked by the AlGaAs potential energy barrier at the Ge/AlGaAs/GaAs heterojunction when crossing into GaAs under reverse bias. At high electric field (reverse bias>21V), electrons obtain sufficient energy from the electric field to surmount the AlGaAs potential barrier, hence a large current is observed.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

For instance, the control layer may be realised using InGaP (indium gallium phosphate) or AlInP, lattice matched to Ge and GaAs. The first semiconductor layer may be fabricated from GaAs, while the second semiconductor layer may be fabricated from Ge. Other combination of semiconductor alloys may be used for the first semiconductor layer and the second semiconductor layer, such as InGaAs, InGaP and InP. One or more of the control layer, the first semiconductor layer and the second semiconductor layer may also be doped or undoped with dopants of the same or different polarities.

The invention claimed is:

1. An avalanche photodiode comprising
   a first semiconductor layer that absorbs photons of a first wavelength range and having a first energy bandgap;
   a second semiconductor layer that absorbs photons of a second wavelength range and having a second energy bandgap, the second energy bandgap being different from the first energy bandgap; and
   a control layer between the first semiconductor layer and the second semiconductor layer, the control layer having a third energy bandgap engineered to suppress carriers created from dark current and to allow for a photocurrent with a substantially vertical profile near the breakdown voltage of the avalanche photodiode.

2. The avalanche photodiode of claim 1, wherein the substantially vertical photocurrent profile occurs around 1 to 2 volts before the breakdown voltage of the avalanche photodiode.

3. The avalanche photodiode of claim 1, the third energy bandgap being greater than either the first energy bandgap or the second energy bandgap.

4. The avalanche photodiode of claim 1, wherein the first semiconductor layer is a Ge photon absorption layer and the first wavelength range is from around 800 nm to around 1700 nm.

5. The avalanche photodiode of claim 4, wherein the second semiconductor layer is a GaAs photon absorption layer and the second wavelength range is from around 400 nm to around 870 nm.

6. The avalanche photodiode of claim 4, wherein the control layer is a $Al_xGa_{1-x}As$ layer, wherein x is a mole fraction between Al and Ga, where $0 \leq x \leq 1$.

7. The avalanche photodiode of claim 6, wherein the Ge photon absorption layer is doped.

8. The avalanche photodiode of claim 7, wherein the GaAs photon absorption layer is undoped.

9. The avalanche photodiode of claim 7 wherein the GaAs photon absorption layer is doped with a polarity that is the same as the Ge photon absorption layer.

10. The avalanche photodiode of claim 7, wherein the $Al_xGa_{1-x}As$ layer is undoped.

11. The avalanche photodiode of claim 7, wherein the $Al_xGa_{1-x}As$ layer is doped with a polarity that is the same as the Ge photon absorption layer.

12. The avalanche photodiode of claim 7, wherein the Ge photon absorption layer is doped with a p-type dopant.

13. The avalanche photodiode of claim 1, wherein the combined thickness of the first semiconductor layer, the second semiconductor layer and the control layer is at least 600 nm.

14. The avalanche photodiode of claim 1, wherein the control layer acts as an interface between the first semiconductor layer and the second semiconductor layer, so that a first surface of the control layer is in contact with the first semiconductor layer and a second surface that is opposite to the first surface of the control layer is in contact with the second semiconductor layer.

* * * * *